United States Patent
Lee et al.

(10) Patent No.: US 8,327,218 B2
(45) Date of Patent: Dec. 4, 2012

(54) STORAGE DEVICE WITH IMPROVED READ/WRITE SPEED AND CORRESPONDING DATA PROCESS METHOD

(75) Inventors: Chung-Hsun Lee, Chung Ho (TW); Tzu-Wei Fang, Chung Ho (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 305 days.

(21) Appl. No.: 12/794,742

(22) Filed: Jun. 5, 2010

(65) Prior Publication Data

US 2011/0078541 A1   Mar. 31, 2011

(30) Foreign Application Priority Data

Sep. 25, 2009   (CN) .......................... 2009 1 0232874

(51) Int. Cl.
*H03M 13/00*   (2006.01)

(52) U.S. Cl. ........................................ 714/752; 714/786
(58) Field of Classification Search ................... 714/763
See application file for complete search history.

(56) References Cited

U.S. PATENT DOCUMENTS

| | | | |
|---|---|---|---|
| 7,061,804 B2 * | 6/2006 | Chun et al. ............... | 365/185.17 |
| 7,532,520 B2 * | 5/2009 | Yanagidaira et al. .... | 365/185.29 |
| 7,747,903 B2 * | 6/2010 | Radke .............. | 714/42 |
| 8,010,876 B2 * | 8/2011 | Hsieh et al. .................. | 714/773 |
| 8,086,933 B2 * | 12/2011 | Yamaga ...................... | 714/755 |
| 8,161,355 B2 * | 4/2012 | Fung et al. .................... | 714/763 |

* cited by examiner

*Primary Examiner* — Esaw Abraham
(74) *Attorney, Agent, or Firm* — Cheng-Ju Chiang

(57) ABSTRACT

A storage device and data processing method thereof is described. The invention provides different ECC for different memory pages. The storage device uses the long-bit ECC for easy interference page, and uses the short-bit ECC for hard interference page. Therefore, the accuracy of the data is maintained and the reading/writing speed is increased.

7 Claims, 5 Drawing Sheets

STORAGE DEVICE WITH IMPROVED READ/WRITE SPEED AND CORRESPONDING DATA PROCESS METHOD

BACKGROUND OF THE INVENTION

1. Field of the Invention

The present invention is related to a storage device and a data process method, and more particularly to a non-volatile storage device and corresponding data process method.

2. Description of the Related Art

There are many types of memory used in the storage device and the Flash Memory is one of the mainstream products in the market. As a non-volatile memory, the Flash Memory, compared to the traditional hard disk, is power-save, low-weight, shock-proof, low working temperature, quiet, and high storage speed. In some portable electrical devices, the flash memory has been replaced the traditional hard disk.

The flash memory can be sorted into Single Level per Cell (SLC) and Multiple Level per Cell (MLC). Each memory cell in the memory cell array of SLC can record one bit data by performing charge/discharge procedure. The voltage distribution of the memory cells on the SLC memory is shown in FIG. 1. There are two voltage states after discharging of the memory cell on the SLC memory. The voltage state in the left side of the reference voltage shows the discharged, memory cells distribution, which usually denotes logic data "1". The voltage state in the right side of the reference voltage shows the charged, memory cells distribution, which usually denotes logic data "0".

On the other hand, each memory cell in the MLC memory array can record more than one bit data. Referring to FIG. 2, the charged/discharged, two bits memory cells distributions on the MLC memory array of the different voltages are shown. It can be sorted to four voltage states, after charging/discharging of the two bits memory cells on the MLC memory array, each of which denotes different logic data. The four voltage states can be separated by three reference voltage Vr1, Vr2, Vr3. If the voltage is less than Vr1, which is located at the leftmost side, corresponding memory cells denote logic data "11". If the voltage is between Vr1 and Vr2, the memory cells denote logic data "10". If the voltage is between Vr2 and Vr3, the memory cells denote logic data "00". If the voltage is more than Vr3, the memory cells denote logic data "01". Understandably, the above introduction of the encoder mode is only an example. The logic data denoted by the voltage state can be different according to different encoder modes of the voltages of the non-volatile storage memory.

As shown in FIGS. 1 and 2, even in the same MLC memory cell, there are a plurality of voltage states. The differences between the voltages in different voltage states are closer than that of the SLC memory cells. Referring to FIG. 2, the two voltages are close, one of which is the highest voltage of the voltage state denoting logic data "11" and other one of which is the lowest voltage of the voltage state denoting logic data "10". Consequently, an original voltage state maybe drift to another non-objective voltage state because the MLC memory cell is subject to leakage of storage charges or influences of read/write disturb. In this case, the correctness of the data stored in the two bits MLC flash memory is affected. It will be even worse when there are eight voltage states in one memory cell of a three bits MLC flash memory. As shown in FIG. 2, the memory cell at the leftmost side is easiest to be affected by the neighbored charged, memory cells and results to voltage state's drift.

In order to maintain the accuracy of the input/output data in the flash memory, Error Correction Code (ECC) is usually employed to protect the data. However, during outputting the data, if the data include wrong bits, it would need more time to recover it. That is, if the data read from the flash memory include the wrong bits, it takes ECC a long time to perform recovering procedure. Especially, the more bits are protected by the ECC, the more time is required in the recovering procedure. The read/write time is affected.

With the reduction of the MLC flash memory processing and increasing of numbers of voltage states included in the memory cell, the charges-storage capability of the memory cell is worse, which thereby result in errors in data storage. Subsequently, the high capability of ECC is needed. At the same time, more bits are needed in every length unit protected by ECC. Generally, the redundancy bits of the flash memory are used for storage some managing data. If the redundancy bits are occupied, the storage space of the managing data will be reduced and then may result in lower of managing design flexibility.

Hence, it is desired to provide a storage device with improved read/write speed and accuracy of data and corresponding data process method to solve the above-described problems.

SUMMARY OF THE INVENTION

A storage device in accordance with the present invention comprises memory cells array and at least two error correction modules. The memory cell array comprises a plurality of memory cells. The memory cells are divided into a plurality of memory pages. At least two of the memory pages are stored by same group of memory cells. The at least two error correction modules provide a plurality of Error Correction Code (ECC) with different error correction capability for data on the memory pages of the same group of memory cells.

A data process method in accordance with the present invention comprises the following steps: receiving data; generating a plurality of ECC protecting different numbers of bits according to a memory page in which the data is stored; and storing the data and corresponding ECC to corresponding memory page.

Other objects, advantages and novel features of the invention will become more apparent from the following detailed description when taken in conjunction with the accompanying drawings.

DETAILED DESCRIPTION OF THE PREFERRED EMBODIMENTS

Reference will now be made in the detail to the preferred embodiments of the invention. While the present invention has been described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Figure 3:
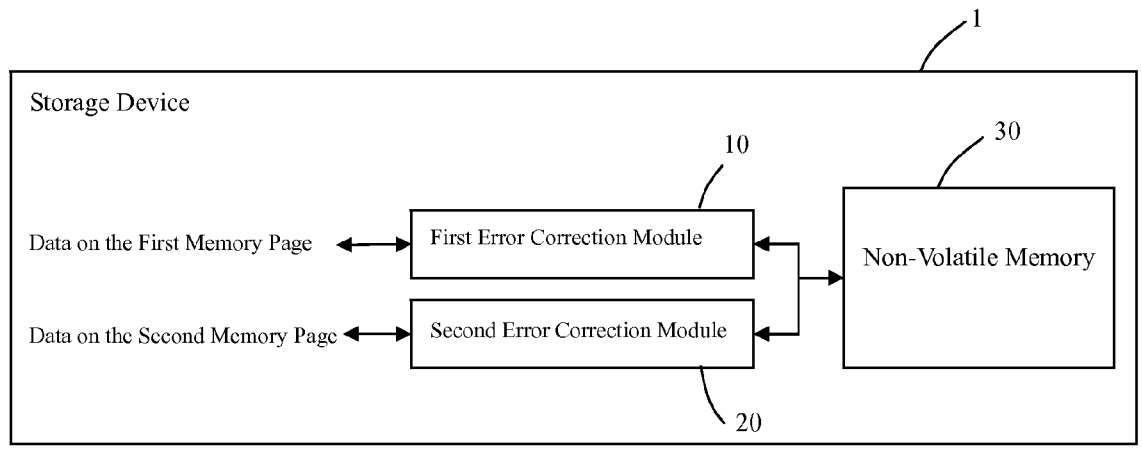
FIG. 3 is a schematic view showing a storage device in accordance with the first embodiment of the present invention.

Referring to FIG. 3, a storage device 1 in accordance with the first embodiment of the present invention is shown. The storage device 1 includes non-volatile memory 30, first error correction module 10 and second error correction module 20.

Figure 4:
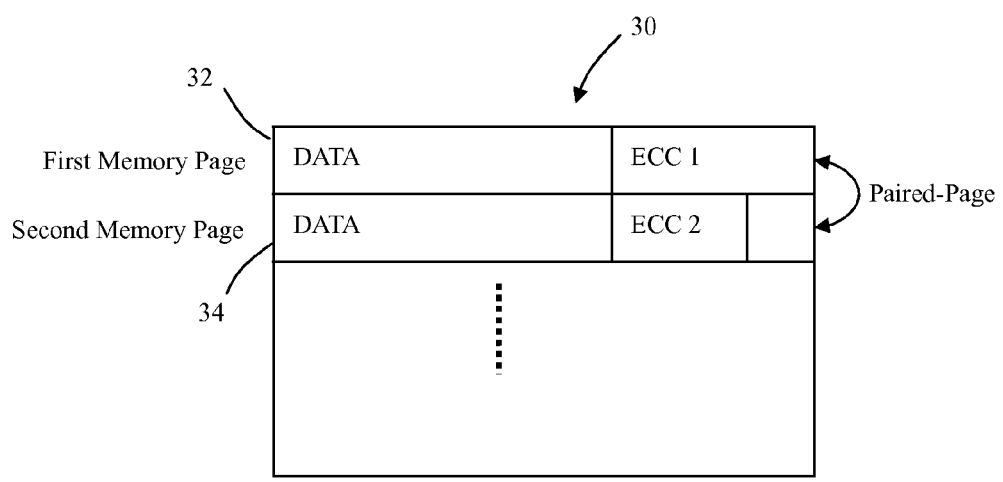
FIG. 4 is a schematic view showing memory page of non-volatile memory.

Together referring to FIGS. 3 and 4, the non-volatile memory 30 includes a plurality of first memory pages 32 and a plurality of second memory pages 34. Each first memory page 32 and second memory page 34 together forms one paired-page. The data on this paired-page is denoted by voltage on the same memory cells of the non-volatile memory array. The first memory page 32 is Least Significant Bit (LSB) page and the second memory page 34 is Most Significant Bit (MSB) page.

The first error correction module 10 couples with non-volatile memory 30. The first Error Correction Code (ECC1) is generated according to data stored in the first memory page 32. The data and ECC1 are transmitted to and stored in the first memory page 32. The second error correction module 20 couples with non-volatile memory 30. The second Error Correction Code (ECC2) is generated according to data stored in the second memory page 34. The data and ECC2 are transmitted to and stored in the second memory page 34. The correcting capability of ECC1 is larger than that of ECC2. Therefore, the number of bits of ECC1 is larger than the number of bits of ECC2. As shown in FIG. 4, the bits occupied by ECC1 in the first memory page 32 are more than the bits occupied by ECC2 in the second memory page 34.

As above-described, the memory cell with low potential is subject to disturbs and result in un-desired voltage state's drifting, which in turn make it error when reading data. The present invention provides different ECC correction capability for different memory pages with different voltage states in the memory cells, for the influences on the different voltages are different. For example, in the MLC flash memory shown in FIG. 2, the voltage state located at the leftmost shows the memory cell denoted with logic data "11" is easiest to be disturbed. This leftmost voltage state will displace to the next voltage state (logic data "10"), which influences the data of LSB page of the paired-page. That is, the bit, which should be denoted by logic "1", is read as logic "0", because of right drifting of the voltage of the memory cell. Not like the conventional technology that using ECC having same correction capability for every memory page, the present invention provides different ECC having different correction capability for different memory pages.

As for the example shown above, the data on the LSB page is easier disturbed than the data on the MSB page. So, it is the solution that providing ECC with high correction capability for LSB page and providing ECC with low correction capability for MSB page. The accuracy of the data on the LSB page is maintained or improved and the read/write speed on the MSB page is improved.

Figure 5A:
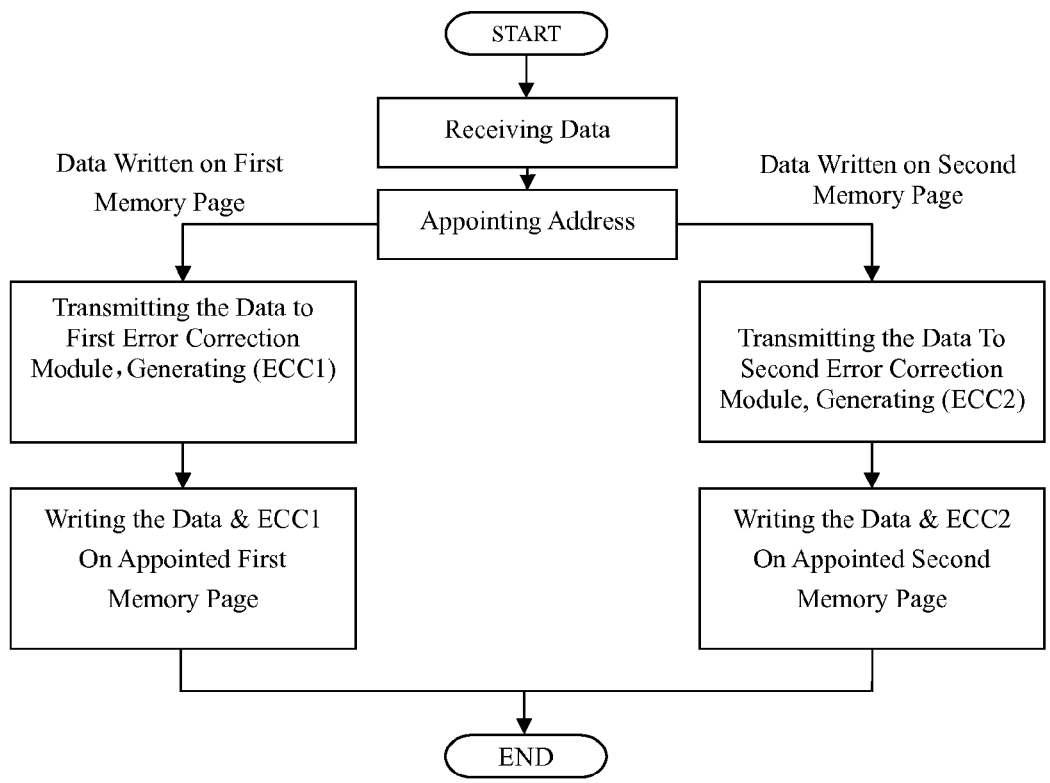
FIG. 5A is a flowchart showing data writing process.

FIG. 5A is a flowchart showing data writing process. The data received by the storage device 1 is distributed and written on the first memory page 32 after logical/physical address thereof is transferred. The data on this first memory page 32 is then transmitted to the first error correction module 10 to thereby generate ECC1. ECC1 and the data are transmitted to the non-volatile memory 30 and written on the appointed first memory page 32.

On the other hand, if the data received by the storage device 1 is distributed and written on the second memory page 34 after logical/physical address thereof is transferred, the data on the second memory page 34 is then transmitted to the second error correction module 20 to generate ECC2. ECC2 and the data are transmitted to the non-volatile memory 30 and written on the appointed second memory page 34.

Figure 5B:
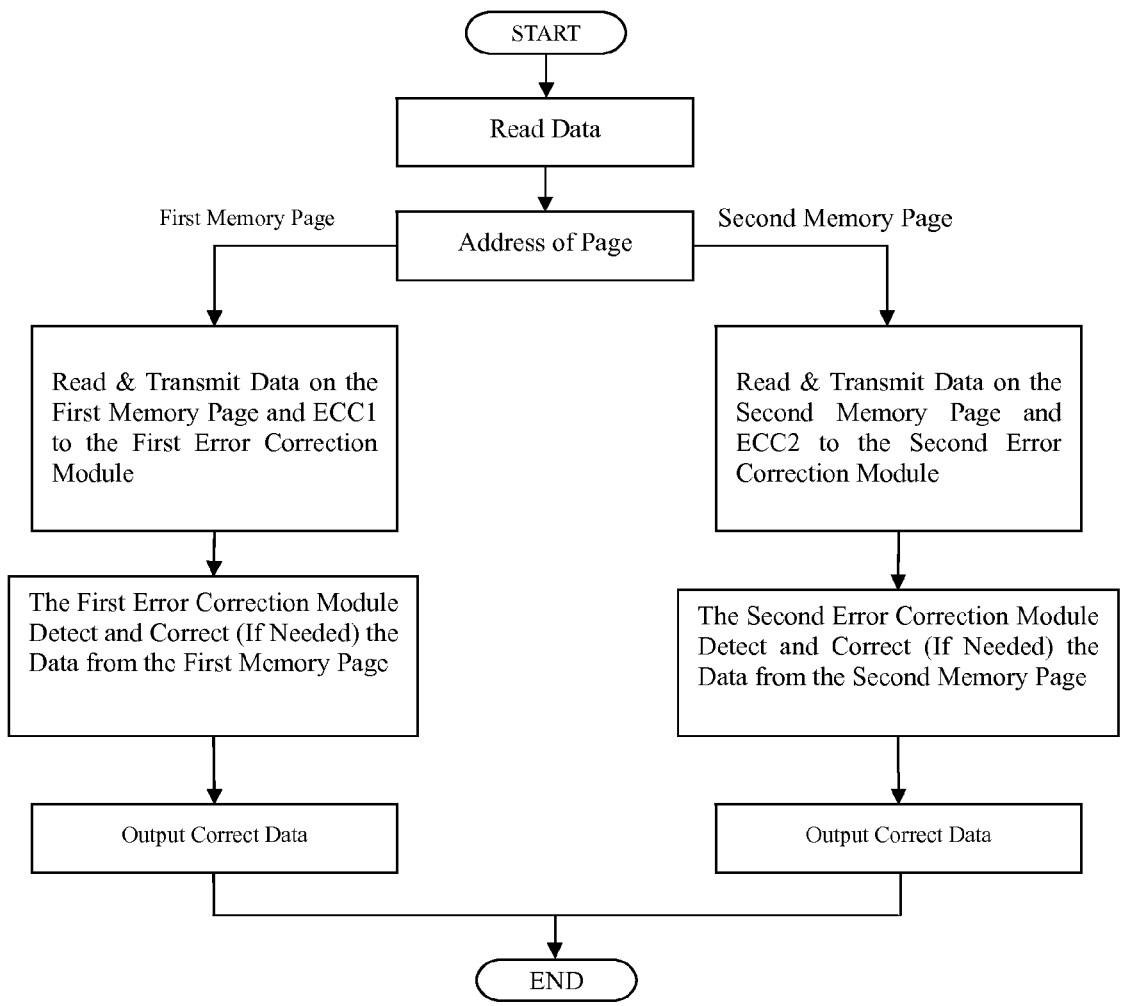
FIG. 5B is a flowchart showing data reading process.

FIG. 5B is a flowchart showing the data reading process. The data in the first memory page and related ECC1 are read and transmitted to the first error correction module 10. Then, the first error correction module 10 detects the data whether has inaccurate bits according to ECC1. If there is error, the error will be corrected and the correct data will be output. If there is no error, the data in the first memory page will be output directly.

On the other hand, the data in the second memory page and related ECC2 are read and transmitted to the second error correction module 20. Then, the second error correction module 20 detects the data whether has inaccurate bits according to ECC2. If there is error, the error will be corrected and the correct data will be output. If there is no error, the data in the second memory page will be output directly.

Because the number of bits protected by ECC2 is smaller than the number of bits protected by ECC1, if the read data has wrong bits and the number of the wrong bits locates in the scope of correction, the read/write speed of the second memory page is faster than the speed of the first memory page.

Figure 6:
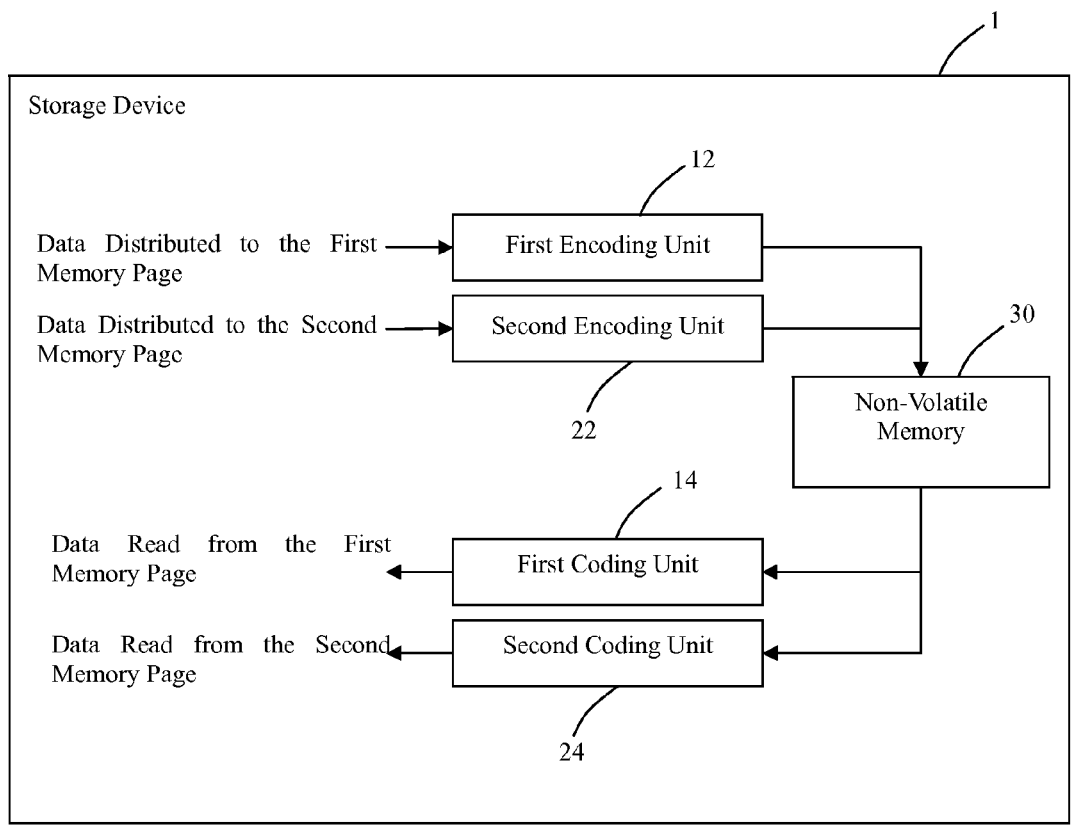
FIG. 6 is a schematic view showing the storage device in accordance with the second embodiment of the present invention.

FIG. 6 is a schematic figure showing the storage device in accordance with the second embodiment of the present invention. The storage device 1 of the second embodiment includes first encoding unit 12, first coding unit 14, second encoding unit 22, second coding unit 24 and non-volatile memory 30.

The data received by the storage device 1 is distributed and written on appointed, first memory page after logical/physical address thereof is transferred. The data on this first memory page is then transmitted to the first encoding unit 12 to thereby generate ECC1. ECC1 and the data are written on the appointed first memory page. On the other hand, the data distributed and written on appointed, second memory page is transmitted to the second encoding unit 22 which correspondingly generates ECC2 with respect to the data. Then, the data and ECC2 are written on the appointed, second memory page.

When the non-volatile memory 30 read the data, the data on the first memory page and corresponding ECC1 are read and transmitted to the first coding unit 14. The first coding unit 14 detects the data on the first memory page whether has inaccurate bits according to ECC1. If there are errors, the data will be corrected and then output. If there no errors, the data will be output directly. On the other hand, the data on the second memory page and corresponding ECC2 are read and transmitted to the second coding unit 24. The second coding unit 24 detects the data on the second memory page whether has inaccurate bits according to ECC2. If there are errors, the data with inaccurate bits will be corrected and then output. If there is no error, the data will be output directly.

Figure 1:
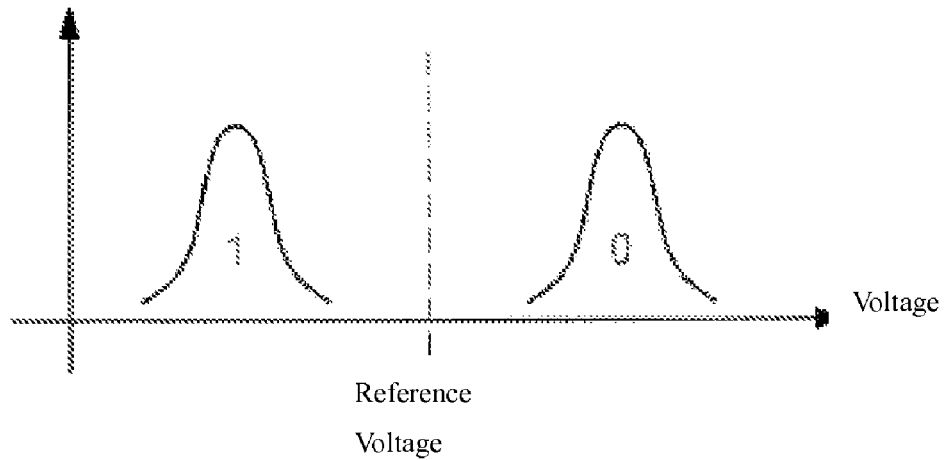
FIG. 1 is a schematic view showing conventional voltage states distribution of SLC memory cells.
Figure 2:
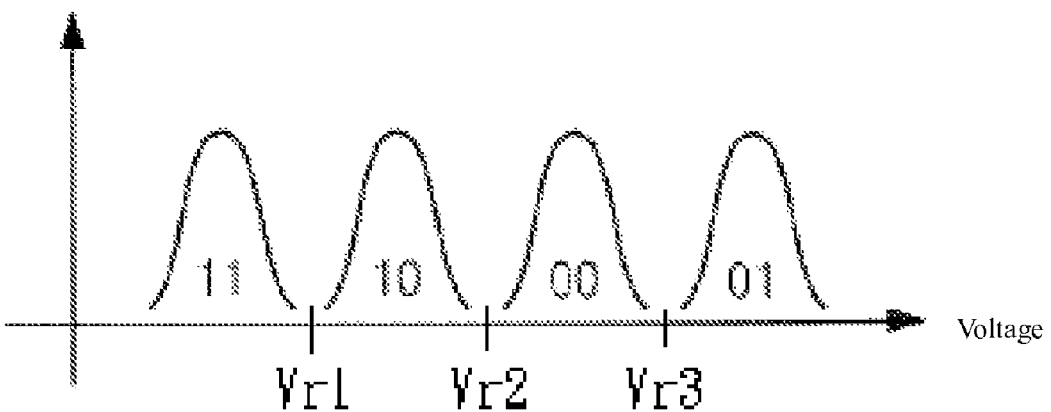
FIG. 2 is a schematic view showing conventional voltage states distribution of MLC memory cells.

The MLC non-volatile memory shown in FIG. 2 is illustrated as an example. The voltage state (located at the leftmost with lowest voltage), which is subject to disturbs, will influence on the data on LSB page. Or in other words, the data, which is subject to disturbs, is those distributed between the lowest voltage state and next lower voltage state in the memory cell and denoting different data (the lowest voltage denotes logic data "11", the next lower voltage denotes logic data "10", and LSB $\overline{page}$ is that between the two different logic d$\overline{ata}$). As for the example shown in FIG. 2, the present invention provides relatively integrated ECC protection capability for LSB page to maintain the accuracy thereof. Oppositely, not like LSB page, the data on MSB page is not subject to disturb. Therefore, the present invention provides short-bit ECC for LSB page. Consequently, the read/write speed of MSB page is improved. Additionally, more redundancy bits can be used to increase flexibility on managing and control of the non-volatile memory.

The above-described embodiment involves storing two bits in single memory cell. However, the scope of the present invention is not limited to this. When storing three bits in single memory cell, three groups of ECC with different correcting capabilities can be provided. For example, when a group of memory cells are used to record data of three memory pages, if low voltages denote data on the page with the least logic address, ECC with high correcting capability will be provided to the page with least logic address. ECC with low correcting capability will be provided to the page with high logic address. ECC with intermediate capability will be provided to the page with logic address between the above-mentioned two pages. Obviously, the present invention does not limit the number of bits in single memory cell.

The non-volatile memory 30 is also not limited to flash memory, which can be Phase Change Memory (PCM), Ferroelectric Random Access Memory (FRAM), or Magnetic Random Access Memory (MRAM).

Additionally, the present invention is not limited to the encoder modes of afore-mentioned voltage. As shown in FIG. 2, according to the present encoder mode, when the voltage located at the leftmost is disturbed and drifted to neighbored voltage (such as no. 2 voltage counting from left side), what it influence is data on LSB page. While, according to another encoder mode, what it influences will be other pages rather than LSB page.

As a whole, the present invention provides long-bit ECC for protecting the data on the page, which is subject to disturb, that is denoted by low voltages. While, for the page, which is not subject to disturb, that is denoted by comparative high voltages, the present invention will provide short-bit ECC to improve read/write speed thereof and save more bits for uses.

Moreover, the above-mentioned first error correction module 10 and the second error correction module 20, or the first encoding unit 12, first coding unit 14, second encoding unit 22 and second coding unit 24, can be housed in controllers of ordinary storage devices. The scope of the present invention is not limited to this. For example, these units can be assembled in the non-volatile memory 30.

The above-described detecting/correcting units (including first error correction module 10 and the second error correction module 20, or the first encoding unit 12, first coding unit 14, second encoding unit 22 and second coding unit 24) can perform their functions either through hardware or software.

The above-described detecting/correcting units can generate ECC by same or different encoder modes. That is, ECC can be a same kind of ECC or different kinds of ECC. Such ECC can be at least one of the following codes: BCH code, Low density parity check, Hamming code, Reed-Solomon code, Binary Golay code, Convolutional code and Turbo code, etc. The difference of ECC in the present invention is that the correcting capability of ECC is different to thereby protect different pages in the same memory cells.

With the capacity of the memory becoming more larger, the present invention does not limit the number of ECC in single memory page. For example, as for LSB page, ECC1 with N bits can be provided for every 512 bytes, or every 1,000 bytes or every 2,000 bytes. As for MSB page, ECC2 with M bits can be provided for every 512 bytes, or every 1,000 bytes or every 2,000 bytes. Here, N>M.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. A storage device comprising:
   memory cells array, comprising a plurality of memory cells, said memory cells divided into a plurality of memory pages, at least two of said memory pages stored by a same group of memory cells; and
   at least two error correction modules, providing a plurality of Error Correction Code (ECC) with different error correction capability for data on said memory pages of said same group of memory cells;
   wherein one of said error correction modules provides long-bit ECC for Least Significant Bit (LSB) pages in the same group of memory cells;
   wherein one of said error correction modules provides short-bit ECC for Most Significant Bit (MSB) pages in the same group of memory cells; and
   wherein one of said error correction modules provides long-bit ECC for data on said memory pages which are distributed between the lowest voltage and next lower voltage of said memory cell.

2. The storage device as claimed in claim 1, wherein said memory array is selected from a group comprising Flash Memory array, Phase Change Memory (PCM) array, Ferroelectric Random Access Memory (FRAM) array, Magnetic Random Access Memory (MRAM) array and their combinations.

3. The storage device as claimed in claim 1, wherein said error correction modules provide said ECC by a same encoding mode.

4. The storage device as claimed in claim 1, wherein said error correction modules provide said ECC by different encoding modes.

5. A data process method, used in a storage device, which includes a plurality of groups of memory cells, wherein each group of memory cells record at least two pages of data, said data process method comprising the following steps:
   receiving data;
   generating a plurality of Error Correction Code (ECC) protecting different numbers of bits according to a memory page in which said data is stored, the generating step further comprising:
      generating long-bit ECC according to data stored on Least Significant Bit (LSB) pages in a same group of memory cells;
      generating short-bit ECC according to data stored on Most Significant Bit (MSB) pages in said same group of memory cells; and
      generating long-bit ECC for data on said memory pages which are distributed between the lowest voltage and next lower voltage of said memory cell and denote different data; and
   storing said data and corresponding ECC to said memory page.

6. The data process method as claimed in claim 5, wherein said ECC are generated by a same encoding mode.

7. The data process method as claimed in claim 5, wherein said ECC are generated by different encoding modes.

* * * * *